US008093597B2

(12) United States Patent
    Briere

(10) Patent No.: US 8,093,597 B2
(45) Date of Patent: Jan. 10, 2012

(54) IN SITU DOPANT IMPLANTATION AND GROWTH OF A III-NITRIDE SEMICONDUCTOR BODY

(75) Inventor: Michael A. Briere, Woonsocket, RI (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 12/661,342

(22) Filed: Mar. 16, 2010

(65) Prior Publication Data

US 2010/0171126 A1    Jul. 8, 2010

Related U.S. Application Data

(63) Continuation-in-part of application No. 12/006,562, filed on Jan. 3, 2008.

(60) Provisional application No. 60/937,101, filed on Jun. 25, 2007.

(51) Int. Cl.
    *H01L 31/0256*    (2006.01)

(52) U.S. Cl. ............. 257/76; 257/E29.089; 257/E21.09; 118/715; 438/22; 438/278; 438/283; 438/287

(58) Field of Classification Search ................. 118/715
    See application file for complete search history.

(56) References Cited

U.S. PATENT DOCUMENTS

| | | | |
|---|---|---|---|
| 4,831,270 A | | 5/1989 | Weisenberger |
| 5,354,584 A | * | 10/1994 | Schmidt ........................ 427/530 |
| 5,374,318 A | | 12/1994 | Rabalais |
| 5,789,265 A | * | 8/1998 | Nitta et al. ...................... 438/22 |
| 5,932,882 A | * | 8/1999 | England et al. .......... 250/492.21 |
| 5,981,393 A | | 11/1999 | Liao |
| 6,123,768 A | | 9/2000 | Moustakas |
| 2001/0029086 A1 | * | 10/2001 | Ogawa et al. ................. 438/448 |
| 2001/0032999 A1 | | 10/2001 | Yoshida |
| 2004/0041169 A1 | * | 3/2004 | Ren et al. ...................... 257/192 |
| 2004/0207029 A1 | | 10/2004 | Braddock |
| 2005/0191828 A1 | | 9/2005 | Al-Bayati |
| 2006/0261352 A1 | | 11/2006 | Takahashi |
| 2008/0315129 A1 | | 12/2008 | Briere |

FOREIGN PATENT DOCUMENTS

WO    WO 98/56046    12/1998

OTHER PUBLICATIONS

Sazio et al. ("Fabrication of in Situ Ohmic Contacts Patterned in Three Dimensions using Focused Ion Beam During Molecular Beam Epitaxial Growth", J. Vac. Sci. Technol. B 15(6), pp. 2337-2341).*

(Continued)

*Primary Examiner* — Charles Garber
*Assistant Examiner* — Yasser Abdelaziez
(74) *Attorney, Agent, or Firm* — Farjami & Farjami LLP

(57) ABSTRACT

In one embodiment a method enabling in situ dopant implantation during growth of a III-nitride semiconductor body, comprises establishing a growth environment for the III-nitride semiconductor body in a composite III-nitride chamber having a dopant implanter and a growth chamber, growing the III-nitride semiconductor body in the growth chamber, and implanting the III-nitride semiconductor body in situ in the growth chamber using the dopant implanter. A semiconductor device produced using the disclosed method comprises a III-nitride semiconductor body having a first conductivity type formed over a support substrate, and at least one doped region produced by in situ dopant implantation of the III-nitride semiconductor body during its growth, that at least one doped region having a second conductivity type.

20 Claims, 5 Drawing Sheets

OTHER PUBLICATIONS

Rubin et al. ("P-type gallium nitride by reactive ion-beam molecular beam epitaxy with ion implantation, diffusion or coevaporation of Mg", Applied Physics Letters, (1), pp. 64-66, 1994).*

Hashimoto et al. ("Focused ion beam doping for GaAs MBE growth", Microelectronic Engineering, 4, pp. 181-193, 1986).*

* cited by examiner

IN SITU DOPANT IMPLANTATION AND GROWTH OF A III-NITRIDE SEMICONDUCTOR BODY

This application is a continuation-in-part of co-pending application Ser. No. 12/006,562, filed on Jan. 3, 2008, by Applicant, which in turn claims priority to Provisional Patent Application Ser. No. 60/937,101, filed on Jun. 25, 2007 by Applicant. The disclosure and contents of both those applications are hereby incorporated fully by reference into the present application. The present application claims priority to both of those earlier filed applications.

DEFINITION

In the present application, "III-nitride refers to a compound semiconductor that includes nitrogen and at least one group III element, such as, but not limited to, GaN, AlGaN, InN, AlN, InGaN, InAlGaN and the like."

BACKGROUND OF THE INVENTION

1. Field of the Invention

The present invention is generally in the field of semiconductors. More specifically, the present invention is in the field of fabrication of compound semiconductors.

2. Background Art

One of the challenges encountered in III-nitride semiconductor device fabrication centers on doping of a III-nitride semiconductor body without compromising its stoichiometric integrity. Specifically, it is known that at high temperatures, for example temperatures greater than approximately 800° C., nitrogen may escape from the III-nitride body, resulting in its decomposition.

Nevertheless, important steps in the semiconductor device fabrication process require processing at high temperature. For example the annealing step relied upon to repair implantation damage, as well as to activate dopant ions, typically requires such high temperatures. As a result, the relatively low decomposition temperature of III-nitride semiconductor materials presents a technical barrier to performance of the dopant implantation and annealing processes commonly used to form P-N junctions in a semiconductor body.

One conventional approach to overcoming, or at least circumventing, the problem of III-nitride doping utilizes a technique of growing the dopants into the III-nitride body as it is formed, rather than performing a dopant implantation. A significant drawback of that approach, however, is that the doping performed in that manner results in relatively homogenously doped layers of the III-nitride body. As a result, differential doping is effectuated only vertically, so that spatially selective doping in the lateral direction cannot be achieved directly through growth.

Thus, there is a need to overcome the drawbacks and deficiencies in the art by providing a solution that enables laterally as well as vertically selective spatially defined doping of a III-nitride semiconductor body, while maintaining the structural and stoichiometric properties of the semiconductor material.

SUMMARY OF THE INVENTION

In situ dopant implantation and growth of a III-nitride semiconductor body, substantially as shown in and/or described in connection with at least one of the figures, as set forth more completely in the claims.

DETAILED DESCRIPTION OF THE INVENTION

Figure 1:
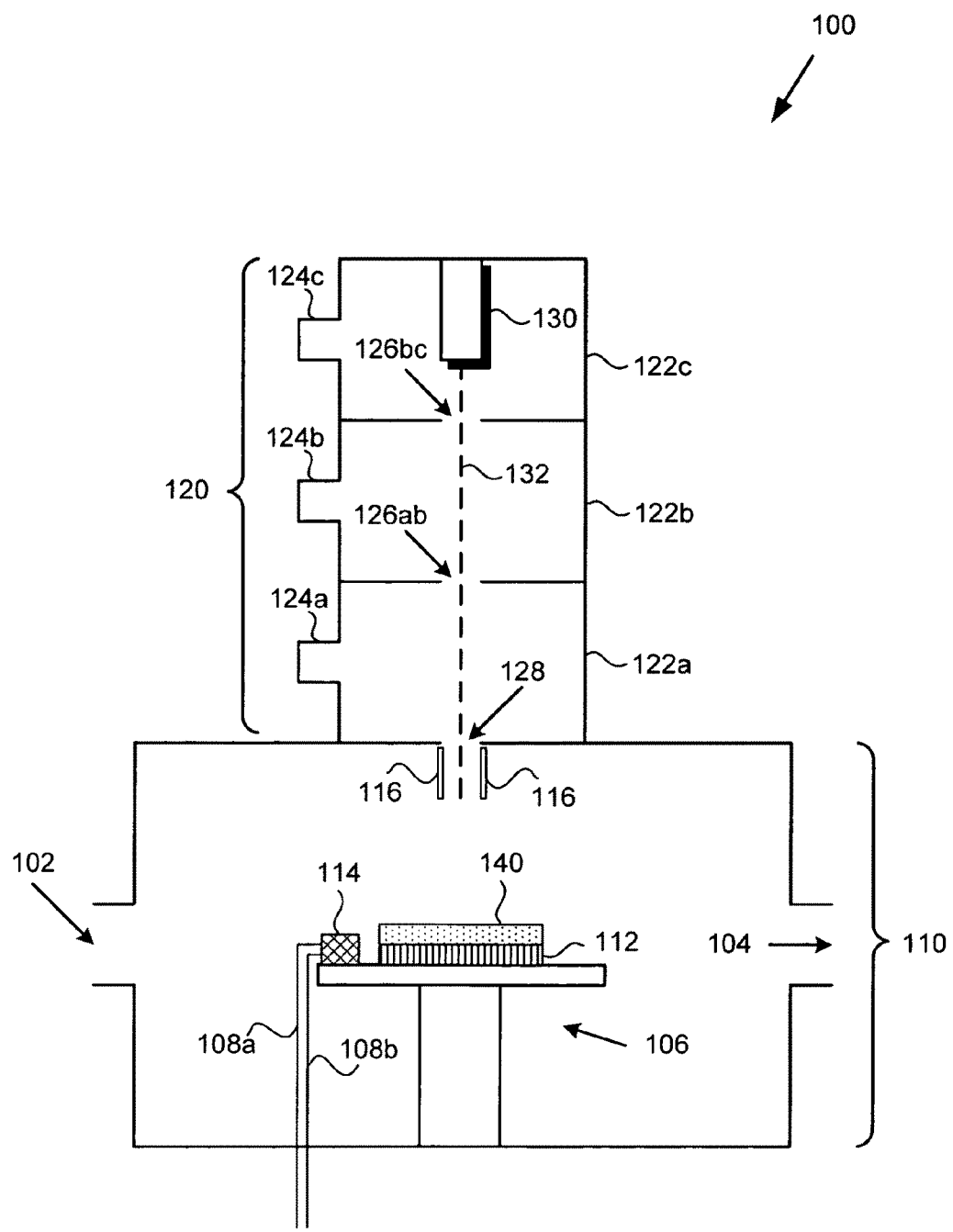
FIG. 1 shows a cross-sectional block diagram of a composite III-nitride chamber for in situ dopant implantation during growth of a III-nitride semiconductor body, according to one embodiment of the present invention.

The present invention is directed to in situ dopant implantation and growth of a III-nitride semiconductor body. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals.

The present inventor has realized that selective doping of spatially defined regions within a III-nitride semiconductor body can be performed by dopant implantation without compromising the structure or stoichiometry of the III-nitride semiconductor material, when dopant implantation is performed in situ to a growth environment for the III-nitride semiconductor body. As a result, the present application discloses an approach that makes it possible to perform junction engineering in a III-nitride semiconductor body. In addition, because the present inventive concepts may be applied to facilitate either N type or P type dopant implantation, the fabrication of P-channel devices, which is particularly problematic for the conventional art, is rendered significantly simpler and more economical to perform.

FIG. 1 shows a cross-sectional block diagram of composite III-nitride chamber 100 for in situ dopant implantation during growth of a III-nitride semiconductor body, according to one embodiment of the present invention. As shown in FIG. 1, composite III-nitride chamber 100 comprises growth chamber 110, dopant implanter 130, and transition chamber 120 including differential pressure cells 122a, 122b, and 122c. Also shown in FIG. 1 is support substrate 112 to support growth of III-nitride semiconductor body 140, such as a GaN body, for example. Support substrate 112 may be selected from any suitable substrate material for the growth of a III-nitride semiconductor, and may include silicon, silicon carbide, sapphire, and when available, a native III-nitride semiconductor substrate, for example.

According to the present embodiment, growth chamber 110 includes platform 106, which may be a rotating platform, for example, on which support substrate 112 may be placed during growth and dopant implantation of III-nitride semiconductor body 140. As shown in FIG. 1, growth chamber 110 is equipped with intake port 102 to allow for the entry of reactant gas, as well as output port 104 for the exit of reactant gas. As further shown in FIG. 1, in some embodiments, growth chamber 110 of composite III-nitride chamber 100 may also include Faraday cup 114. When present, Faraday cup 114 may be linked to a voltage current meter (not shown in FIG. 1) through wires 108a and 108b, to measure the dosage of dopant ions being received from dopant implanter 130.

Dopant implanter 130 provides dopant ions for implantation into III-nitride semiconductor body 140 along ion path 132, and may perform selective implantation of portions of III-nitride semiconductor body 140 using a direct write type ion beam procedure, for example. In that embodiment, dopant implanter 130 may require a high vacuum environment. Such an environment is provided in composite III nitride chamber 110 by transition chamber 120. In addition to providing a suitable environment for operation of dopant implanter 130, transition chamber 120 also serves to interface dopant implanter 130 with growth chamber 110, which may not be operating in a high vacuum state.

In order to obtain such a high vacuum condition while allowing dopant implanter 130 to be in communication with growth chamber 110, differential pumping may be used to evacuate transition chamber 120. As shown in FIG. 1, in one embodiment, transition chamber 120 may include several differential pressure cells 122a, 122b, and 122c. Each differential pressure cell 122a, 122b, and 122c is in communication with an adjacent differential pressure cell through respective apertures 126ab and 126bc. It is noted that ion path 132 passes through apertures 126bc and 126ab to travel through transition chamber 120, which interfaces dopant implanter 130 and growth chamber 110 through linking aperture 128, through which ion path 132 also passes. To create the high vacuum condition, each differential pressure cell 122a, 122b, and 122c may be evacuated using respective pumps 124a, 124b, and 124c. Each of pumps 124a, 124b, and 124c may be in direct communication with the space enclosed by respective differential pressure cells 122a, 122b, and 122c, as shown schematically in FIG. 1.

A composite III-nitride chamber according to the present embodiment may further include a plurality of deflection plates, such as deflection plates 116, positioned inside growth chamber 110, on either side of linking aperture 128. Deflection plates 116 can be used to change the direction of travel of the dopant ions entering growth chamber 110, for example. It is noted that that deflection plates 116 may be used to direct the dopant ions at Faraday cup 114 periodically, for instance, approximately 1% of the time, in order to measure the ion dosage being directed at III-nitride semiconductor body 140, and in turn, to estimate the concentration of dopants implanted therein.

The operation of exemplary composite III-nitride chamber 100 will be further described by reference to flowchart 200, in FIG. 2, which describes the steps, according to one embodiment of the present invention, of a method for enabling in situ dopant implantation during growth of a III-nitride semiconductor body. It is noted that certain details and features have been left out of flowchart 200 that are apparent to a person of ordinary skill in the art. For example, a step may comprise one or more substeps or may involve specialized equipment or materials, as known in the art. While steps 210 through 250 indicated in flowchart 200 are sufficient to describe one embodiment of the present invention, other embodiments of the invention may utilize steps different from those shown in flowchart 200.

Beginning with step 210 of flowchart 200 and referring to FIG. 1, step 210 of flowchart 200 comprises establishing a growth environment for growing a GaN body, e.g., III-nitride semiconductor body 140, in composite III-nitride chamber 100 including dopant implanter 130. In the interests of providing a specific example, the present method will hereinafter refer to "GaN body 140," rather than "III-nitride semiconductor body 140." However, it is emphasized that GaN body 140 may correspond to a body formed from any combination of suitable III-nitride semiconductor materials, as described in the definition section disclosed as part of the background of the present application. Typically, the only constraint placed upon the composition of GaN body 140 is that it comprise at least one layer of III-nitride semiconductor material. In some embodiments, GaN body 140 may comprise a first III-nitride semiconductor layer and a second III-nitride semiconductor layer formed over the first III nitride semiconductor layer, for example, wherein the second III-nitride semiconductor layer comprises a III-nitride semiconductor having a wider band gap than the III-nitride semiconductor forming the first III-nitride semiconductor layer.

Step 210 may be performed in composite III-nitride chamber 100 including dopant implanter 130, through establishment of a suitable temperature and gas pressure for growth of the GaN body in growth chamber 110. For example, reactant gas may be fed through intake port 102, and thermal equilibrium may be established at a temperature greater than approximately eight hundred degrees Centigrade (800° C.). In addition, through pumping performed by pumps 124a, 124b, and 124c, respective differential pressure cells 122a, 122b, and 122c may be evacuated until a suitable, high vacuum condition is obtained in the environment of transition chamber 120. The pressure conditions in growth chamber 110, as well as the configuration of transition chamber 120 may depend on the type of growth that is being practiced.

For example, if GaN body 140 is being grown using metalorganic chemical vapor deposition (MOCVD), the pressure inside of growth chamber 110 may be in the range of a few hundred millitor (mTorr). Alternatively, if molecular-beam epitaxy (MBE) is used for growing GaN body 140, the pressure inside growth chamber 110 may be approximately $10^{-7}$ to $10^{-11}$ Torr, comparable to the high vacuum required by dopant implanter 130. Thus, although the embodiment shown in FIG. 1 includes transition chamber 120 having three differential pressure cells 122a, 122b, and 122c to interface the different pressure environments required for respective dopant implanter 130 and growth chamber 110, other embodiments corresponding to different pressure differentials may have more, or fewer, differential pressure cells. Moreover, where the growth environment and the environment required by dopant implanter 130 are comparable, for example, when growth proceeds by MBE, transition chamber 120 may be absent entirely, and dopant implanter 130 may interface growth chamber 110 directly, or even by included within growth chamber 110.

Figure 2:
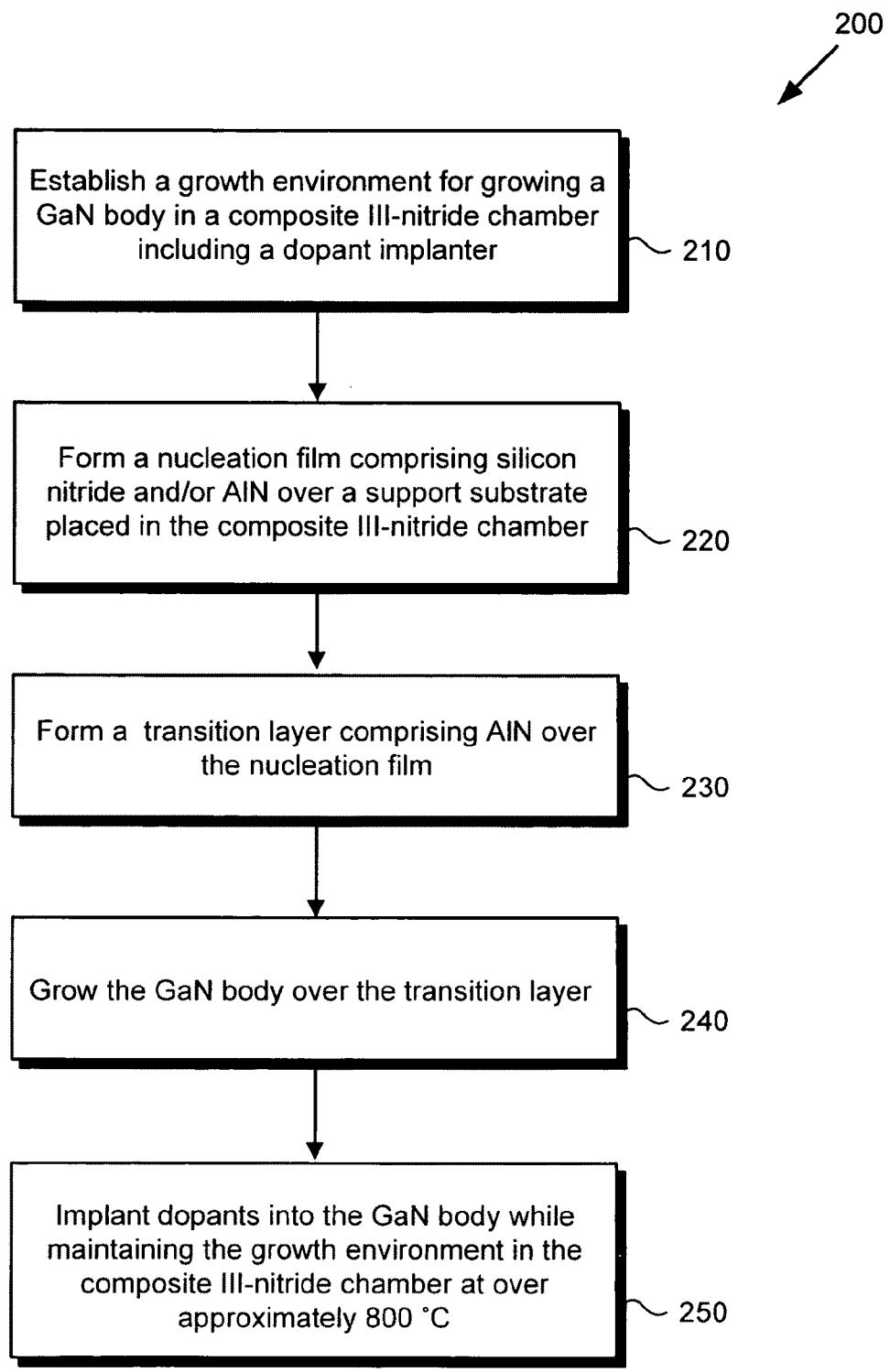
FIG. 2 shows a flowchart presenting a method for enabling in situ dopant implantation during growth of a III-nitride semiconductor body, according to one embodiment of the present invention.

Continuing with step 220 of FIG. 2, with reference to FIG. 1, step 220 of flowchart 200 comprises forming a nucleation film (not shown in FIG. 1) comprising silicon nitride and and/or aluminum nitride (AlN) over support substrate 112 placed in composite III-nitride chamber 100. Step 220 is typically a preliminary step to prepare support substrate 112 for growth of GaN body 140. Step 220 is followed by step 230, comprising forming a transition layer (also not shown in FIG. 1) comprising AlN over the nucleation film. The transition layer formed in step 230 may itself correspond to a plurality of distinguishable layers mediating the lattice transition from support substrate 112 to GaN body 140. The transition layer may include, for example, a series of aluminum gallium nitride (AlGaN) layers comprising progressively less aluminum and more gallium, until a suitable transition to GaN body 140 is achieved.

Continuing with step 240 of flowchart 200, step 240 comprises growing GaN body 140 over the transition layer formed in step 230. As previously described, step 240 may be performed in growth chamber 110 of composite III nitride chamber 100. Growth of GaN body 140 may be performed by MOCVD or MBE, for example, and may proceed in a suitable atmospheric and thermal environment for growing GaN, such as in the presence of a nitrogen precursor gas like ammonia, additional reactant gases such as trimethylgallium (TMG) and trimethylaluminum (TMA), and at a temperature of greater than approximately 800° C., for instance. GaN body 140 may by grown as a doped GaN body, such as an N type or a P type GaN body, for example. Alternatively, GaN body 140 may be grown undoped, in which case GaN body 140 will have a nominal N type conductivity due to the presence of lattice defects formed during the growth process, as known in the art.

Moving to step 250, step 250 of flowchart 200 comprises implanting dopant ions into GaN body 140 while maintaining the growth environment in composite III-nitride chamber 100 at over approximately 800° C. Step 250 may be performed by dopant implanter 130 in combination with growth chamber 110, and may result in any desired species being implanted into GaN body 140. Thus, N type dopants such as silicon (Si) and P type dopants such as magnesium (Mg) may be implanted, for example. Where GaN body 140 is grown undoped, for example, N type doping and P type doping may both be performed, resulting in laterally adjacent regions of GaN body 140 having opposite conductivity types.

In some embodiments of the present invention, relatively low energy surface implantation of GaN body 140 may be preferred, utilizing implantation energies of less than approximately 100 keV, for example, from 10 to 100 keV. In other embodiments, however, deeper penetration into GaN body 140 may be desired, so that implantation energies of more than one MeV may be employed. Thus implantation may be performed using a broad range of implantation energies, from approximately 10 keV to more than 1000 keV.

In one embodiment, the ion beam used for dopant implantation can be as wide as 1/10 microns wide, for example. Moreover, in some embodiments, relatively low implantation energies are used in order to implant the dopants near the surface during the growth process, for example, to a depth of approximately fifty to approximately 200 angstroms (50-200 Å) in GaN body 140. Alternatively, in some embodiments relatively high implantation energies may be utilized to form deeply placed spatially defined doped islands in GaN body 140. GaN body 140 can be doped to any concentration, for example, GaN body 140 can be doped with an ion dose in the range of approximately $10^{12}/cm^2$ to $10^{16}/cm^2$. It is contemplated that in some embodiments dopant implantation and growth of GaN body 140 may occur substantially concurrently. In other embodiments, however, the two processes may alternate in a cyclical fashion, so that growth and dopant implantation of GaN body 140 proceeds through an iterative set of growth steps and dopant implantation steps performed in situ.

Figure 3:
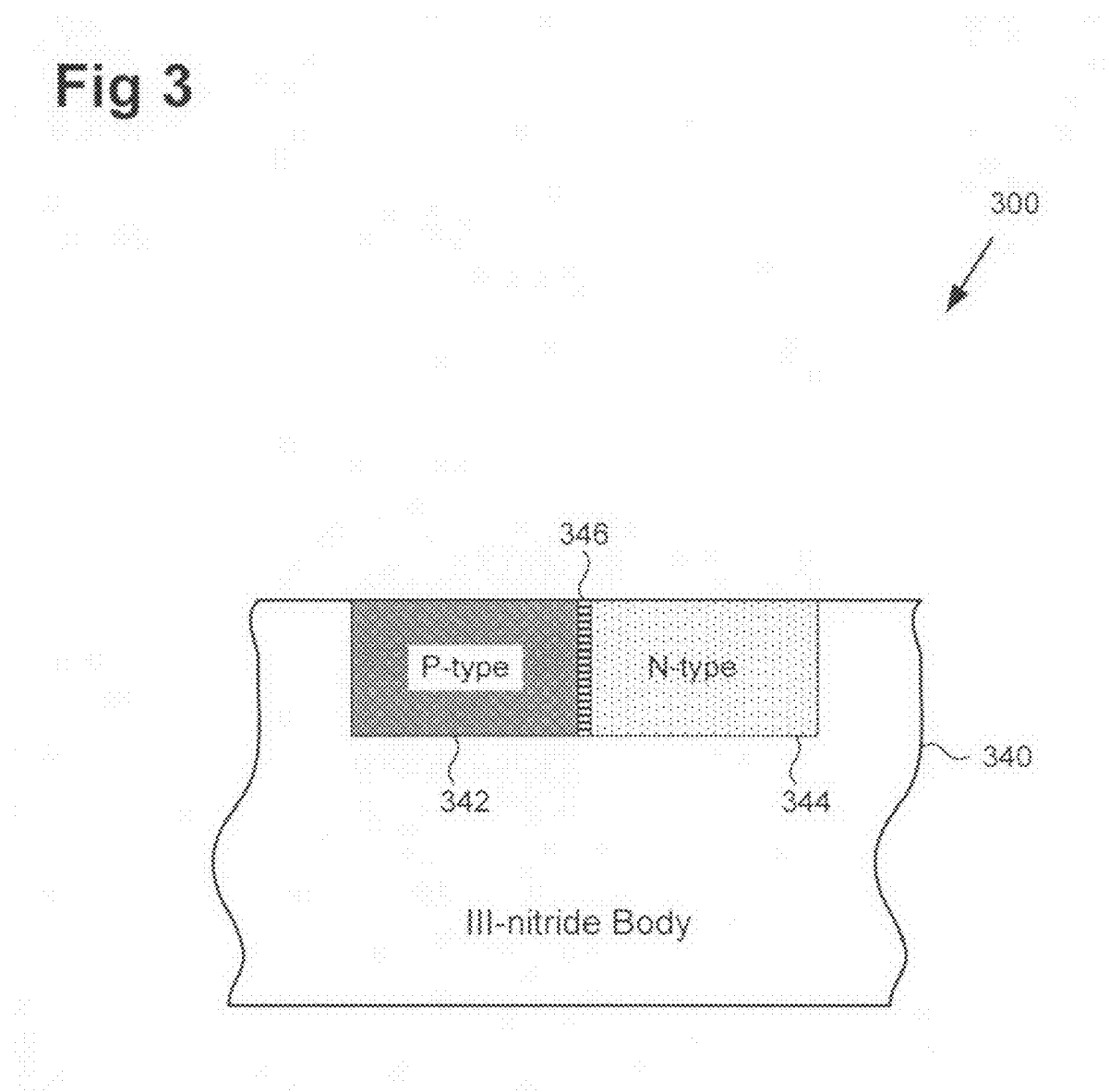
FIG. 3 shows a cross-sectional representation of a P-N junction formed in a III-nitride semiconductor body, according to one embodiment of the present invention.
Figure 4:
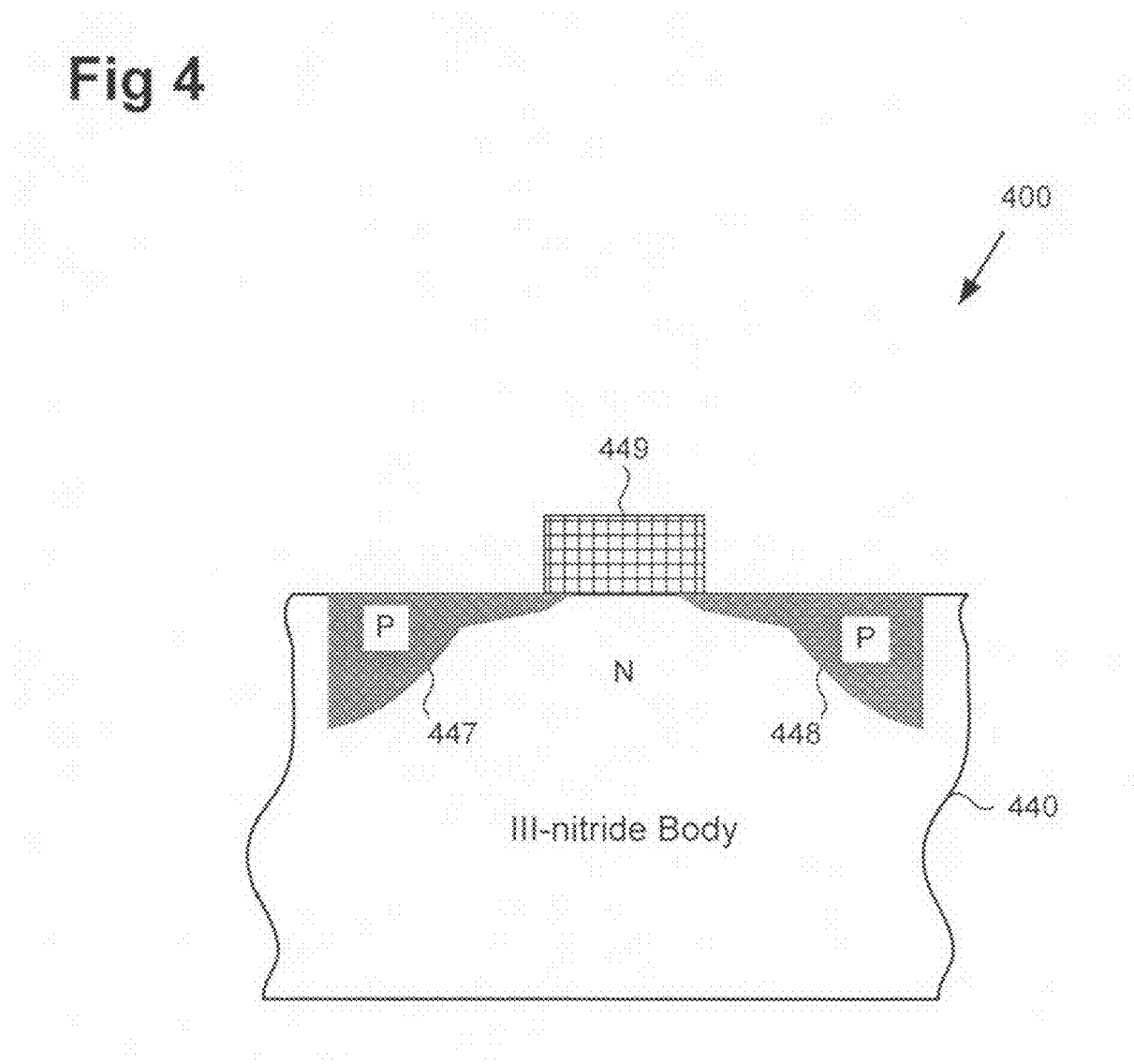
FIG. 4 shows a cross-sectional representation of a III-nitride P-channel field-effect transistor (PFET), according to one embodiment of the present invention.
Figure 5:
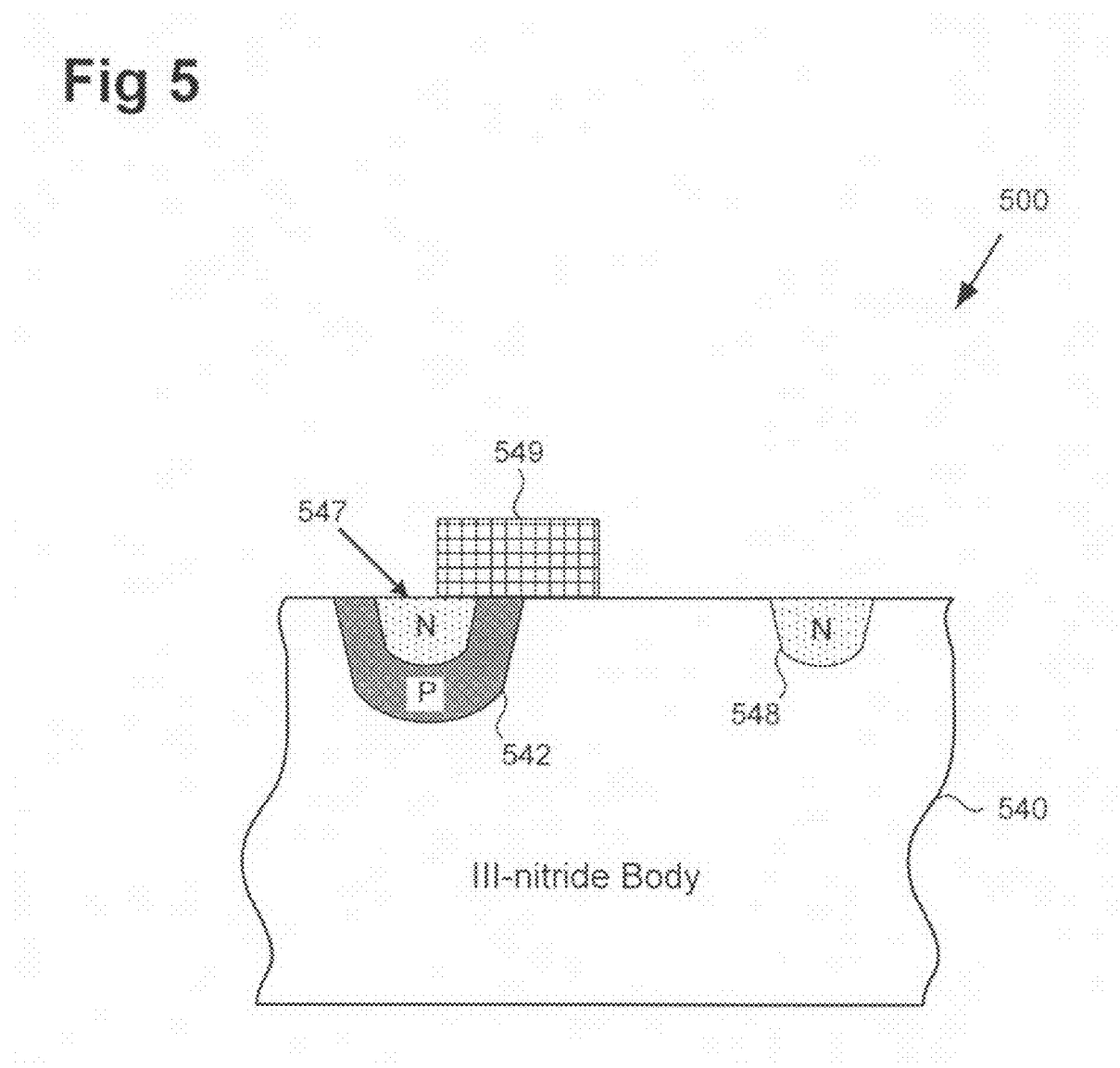
FIG. 5 shows a cross-sectional representation of a lateral diffusion III-nitride semiconductor device, according to one embodiment of the present invention.

Some of the advantages accruing from the presently disclosed inventive concepts may be seen by reference to FIGS. 3, 4, and 5. FIGS. 3, 4, and 5 show respective III-nitride semiconductor structures formed according to the principles described in the present application. Each of the structures is representative of the advantages associated with enablement of spatially defined selective doping of a III-nitride body, and the variety of junction engineering techniques that are facilitated by the present approach.

FIG. 3 shows a cross-sectional representation of a P-N junction formed in a III-nitride semiconductor body, according to one embodiment of the present invention. Structure 300, in FIG. 3, includes P type doped region 342 and N type doped region 344 formed in III-nitride semiconductor body 340. III-nitride semiconductor body 340 corresponds to III-nitride semiconductor body 140, shown in FIG. 1, and may be a GaN body, for example. As shown in FIG. 3, both of P type doped region 342 and N type doped region 344 are spatially defined within III-nitride semiconductor body 340, and have been selectively formed so as to be laterally adjacent one another. As a result, P type doped region 342 and N type doped region 344 have been advantageously implanted into III-nitride body 340 to produce P-N junction 346 at their interface. Structure 300 may be utilized in the implementation of a diode, for example, or as a base for a bipolar junction transistor fabricated in III-nitride body 340.

Continuing to FIG. 4. FIG. 4 shows a cross-sectional representation of a III-nitride P-channel field-effect transistor (PFET), according to one embodiment of the present invention. Structure 400, in FIG. 4, includes gate structure 449, as well as P type doped source region 447 and P type doped drain region 448 formed in N type III-nitride semiconductor body 440. III-nitride semiconductor body 440 corresponds to III-nitride semiconductor body 140, shown in FIG. 1, and may be a GaN body, for example. As shown in FIG. 4, both of respective P type source and drain regions 447 and 448 include deeply implanted portions and shallower extension regions, and give some indication of the degree of spatial selectivity that may be achieved using the present inventive concepts. Moreover, structure 400 shows formation of P type doped regions through selective spatially defined implantation of III-nitride body 440, which as is well known in the art, is highly impracticable using conventional approaches.

Turning now to FIG. 5, FIG. 5 shows a cross-sectional representation of a lateral diffusion III-nitride semiconductor device, according to one embodiment of the present invention. Structure 500, in FIG. 5, includes gate structure 549, P type doped region 542, and N type doped regions 547 and 548 formed in III-nitride semiconductor body 540. III-nitride semiconductor body 540 corresponds to III-nitride semiconductor body 140, shown in FIG. 1, and may be a GaN body, for example. As shown in FIG. 5, N type doped region 547, which may serve as a source region, is formed within P type doped region 542 formed in III nitride semiconductor body 540. Although not explicitly shown in FIG. 5, gate structure 549 may include a gate insulator layer, such as a silicon nitride layer, for example. Thus, structure 500 may correspond to fabrication of a lateral diffusion MISFET in III-nitride, analogous to a laterally diffused metal oxide semiconductor (LDMOS) transistor conventionally formed in silicon.

Thus, according to the present application, the disclosed novel concepts enable laterally selective doping of a III-nitride semiconductor body, while concurrently maintaining the structural and stoichiometric properties of the semiconductor material. As a result, the present application discloses an approach that makes it possible to advantageously perform junction engineering in a III-nitride semiconductor body. In addition, because the present inventive concepts may be applied to facilitate either N type or P type dopant implantation, the fabrication of P-channel devices is rendered significantly easier to achieve.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A semiconductor device produced using a method enabling in situ dopant implantation during growth of a III-nitride semiconductor body, said semiconductor device comprising:
   said III-nitride semiconductor body having a first conductivity type formed over a support substrate;
   at least one doped region produced by in situ dopant implantation of said III-nitride semiconductor body during its growth, said at least one doped region having a second conductivity type;
   wherein said in situ dopant implantation of said III-nitride semiconductor body during its growth results in a stoichiometry of said III-nitride semiconductor body being maintained in said semiconductor device.

2. The semiconductor device of claim 1, wherein a portion of said at least one doped region is situated laterally adjacent to at least one region of said III-nitride semiconductor body having said first conductivity type.

3. The semiconductor device of claim 1, wherein said in situ dopant implantation of said III-nitride semiconductor body is performed at a temperature greater than approximately eight hundred degrees Centigrade (800° C.).

4. The semiconductor device of claim 1, wherein said first conductivity type is N type and said second conductivity type is P type.

5. The semiconductor device of claim 1, wherein said semiconductor device comprises a P-N junction.

6. The semiconductor device of claim 1, wherein said semiconductor device comprises a P-channel field-effect transistor (PFET).

7. The semiconductor device of claim 1, wherein said III-nitride semiconductor body comprises gallium nitride (GaN).

8. A method enabling in situ dopant implantation during growth of a III-nitride semiconductor body, said method comprising:
   establishing a growth environment for said III-nitride semiconductor body in a composite III-nitride chamber having a dopant implanter and a growth chamber;
   growing said III-nitride semiconductor body in said growth chamber; and
   implanting said III-nitride semiconductor body in situ in said growth chamber using said dopant implanter;
   said in situ dopant implantation resulting in formation of a P-N junction in said III-nitride semiconductor body.

9. The method of claim 8, wherein said growth environment is maintained in said growth chamber during said implantation step.

10. The method of claim 8, wherein said implanting is performed at a temperature greater than approximately eight hundred degrees Centigrade (800° C.).

11. The method of claim 8, wherein said implanting is performed using a P type dopant.

12. The method of claim 8, wherein said growing said III-nitride semiconductor body is performed using a metalorganic chemical vapor deposition (MOCVD) process.

13. The method of claim 8, wherein said growing said III-nitride semiconductor body is performed using a molecular-beam epitaxy (MBE) process.

14. The method of claim 8, wherein said III-nitride semiconductor body comprises gallium nitride (GaN).

15. The method of claim 8, wherein said growing and said implanting are performed substantially concurrently.

16. A composite III-nitride chamber for in situ dopant implantation during growth of a III-nitride semiconductor body, said composite III-nitride chamber comprising:
   a growth chamber for growing said III-nitride semiconductor body;
   a dopant implanter interfaced with said growth chamber;
   said composite III-nitride chamber configured to perform implantation of said III-nitride semiconductor body by said dopant implanter in situ in said growth chamber using an implantation energy of greater than approximately 10 keV.

17. The composite III-nitride chamber of claim 16, configured to maintain a growth environment for said III-nitride semiconductor body in said growth chamber during said in situ implantation.

18. The composite III-nitride chamber of claim 16, configured to perform said in situ implantation of said III-nitride semiconductor body at a temperature greater than approximately eight hundred degrees Centigrade (800° C.).

19. The composite III-nitride chamber of claim 16, wherein said growth chamber is configured for growing said III-nitride semiconductor body by one of a metalorganic chemical vapor deposition (MOCVD) process and a molecular-beam epitaxy (MBE) process.

20. The composite III-nitride chamber of claim 16, further comprising a transition chamber configured to interface said dopant implanter and said growth chamber, said transition chamber including at least one differential pressure cell.

* * * * *